United States Patent [19]
Appel et al.

[11] Patent Number: 6,030,864
[45] Date of Patent: *Feb. 29, 2000

[54] VERTICAL NPN TRANSISTOR FOR 0.35 MICROMETER NODE CMOS LOGIC TECHNOLOGY

[75] Inventors: Andrew T. Appel, Dallas, Tex.; Frank S. Johnson, Richardson, Tex.

[73] Assignee: Texas Instruments Incorporated, Dallas, Tex.

[ * ] Notice: This patent issued on a continued prosecution application filed under 37 CFR 1.53(d), and is subject to the twenty year patent term provisions of 35 U.S.C. 154(a)(2).

[21] Appl. No.: 08/838,840

[22] Filed: Apr. 11, 1997

Related U.S. Application Data

[60] Provisional application No. 60/015,186, Apr. 12, 1996.

[51] Int. Cl.[7] .............................................. H01L 21/8249
[52] U.S. Cl. ............................................ 438/234; 438/203
[58] Field of Search .................................... 438/234, 200, 438/202, 203, 205, 324; 257/378, 384, 273

[56] References Cited

U.S. PATENT DOCUMENTS

| | | | |
|---|---|---|---|
| 4,120,707 | 10/1978 | Beasom | 438/208 |
| 4,325,180 | 4/1982 | Curran | 438/234 |
| 4,403,395 | 9/1983 | Curran | 438/234 |
| 4,806,499 | 2/1989 | Shinohara | 438/202 |
| 5,066,602 | 11/1991 | Takemoto et al. | 438/234 |
| 5,374,569 | 12/1994 | Yilmaz et al. | 438/234 |
| 5,407,840 | 4/1995 | Manoliu et al. | 438/234 |

OTHER PUBLICATIONS

S. Wolf and R.N. Tauber, Silicon Processing for the VLSI Era, V1 Process Tech., pp. 384–385, 1986.

*Primary Examiner*—Chandra Chaudhari
*Assistant Examiner*—Scott J. Hawranek
*Attorney, Agent, or Firm*—Wade James Brady III; Richard L. Donaldson

[57] ABSTRACT

A method of fabricating a bipolar transistor concurrently with an MOS device comprising the steps of forming an NPN bipolar transistor by providing a semiconductor wafer (1) having a semiconductor region (3) of predetermined conductivity type having a surface. An emitter region (33) and a collector contact region (35) are formed in and extend to the surface of the semiconductor region (3) of predetermined conductivity type with an implant of the predetermined conductivity type. An intrinsic base region (43) is formed extending to the surface by implanting an impurity of opposite conductivity type in the semiconductor region (3) isolating the emitter region (33) from the semiconductor region of predetermined conductivity type. An insulating layer (49) is formed on the semiconductor region of predetermined conductivity type extending over all transitions at the surface of the predetermined conductivity type to the opposite conductivity type. A portion of the intrinsic base region (43) is then converted to an extrinsic base region (43). A portion of the collector contact (35), a portion of the emitter region (33) and a portion of the extrinsic base region (43) extend to the surface and an electrically conductive silicide (61) is formed at the surface on each of the collector contact (35), emitter region (33) and extrinsic base region (43). A CMOS device is formed in the wafer (1) concurrently with the fabrication of the bipolar transistor.

8 Claims, 4 Drawing Sheets

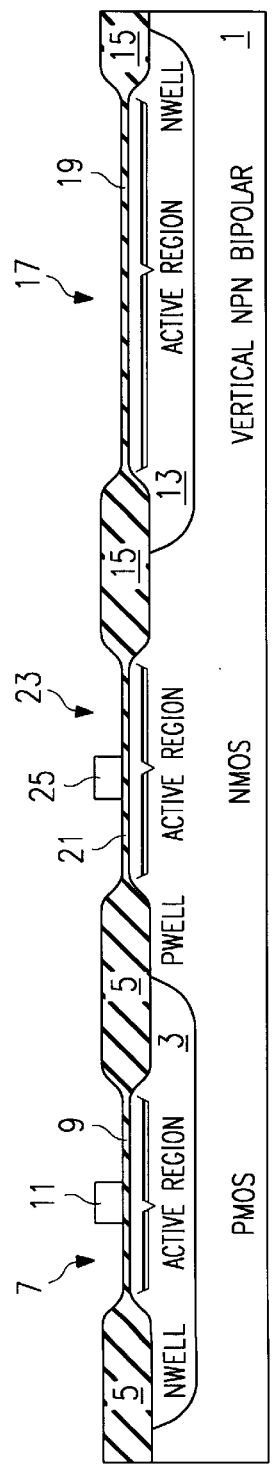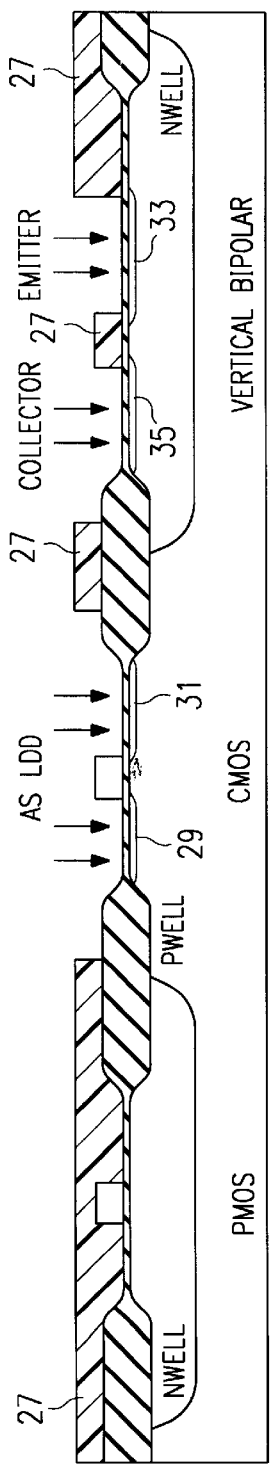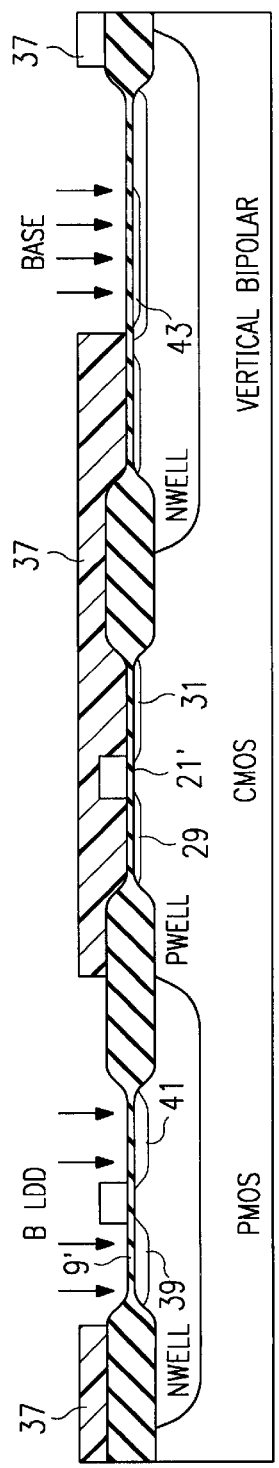

VERTICAL NPN TRANSISTOR FOR 0.35 MICROMETER NODE CMOS LOGIC TECHNOLOGY

This application claims priority under 35 USC § 119(e)(1) of provisional application No. 60/015,186 filed Apr. 12, 1996.

BACKGROUND OF THE INVENTION

1. Field of the Invention

This invention relates to a method of providing a bipolar transistor within a CMOS process flow and, more specifically, to a method of providing a vertical NPN transistor within a CMOS process flow.

2. Brief Description of the Prior Art

Bipolar transistors are better suited to high current applications than are MOS transistors. Furthermore, bipolar transistors are often better suited to analog applications than are MOS transistors since they provide better current and voltage matching, a wider range of linear gain and typically better frequency response and lower noise.

Parasitic bipolar devices are occasionally used in conjunction with CMOS technology to perform special circuit functions. These bipolar devices, which are typically lateral devices built across well boundaries, exhibit very poor device characteristics and are not fully isolated. Such lateral bipolar transistors are defined by lithography and therefore are relatively wide in geometry, relatively slow in operation and have high resistance. These. lateral transistor have a high ratio of peripheral and contact area, to actual device area.

It is therefore apparent that integration of vertical NPN and, PNP bipolar transistors with CMOS transistors is desirable and such integration exists in a variety of BiCMOS technologies. However, in these process flows, many additional masking and deposition steps are required to achieve a compromise optimization of the bipolar and CMOS transistors with typical added process steps of from about 50 to 100% in number through the silicide step compared to the basic standard CMOS process flow. Whereas the performance of these bipolar devices is superior to the bipolar devices fabricated by the process flow of the present invention, these process flows cannot approach the simplicity of the disclosed vertical NPN transistor. No prior art having a "free" vertical NPN transistor within a CMOS process flow is known.

It is therefore apparent that integration of a higher performance bipolar transistor and particularly a higher performance NPN transistor in a CMOS process flow is highly desirable wherein a great deal of added complexity is not added to the process flow to achieve this goal.

SUMMARY OF THE INVENTION

The present invention takes advantage of three unique features; of Texas Instruments' high performance 2.5V CMOS process which is generally set forth in "Oxide Thickness Dependence of Inverter Delay and Device Reliability for 0.25 µm CMOS Technology", Mark Rodder et al. 1994 *IEDM Technical Digest*, page 879, the contents of which are incorporated herein by reference, to fabricate a much higher performance bipolar junction transistor (BJT), preferably an NPN device, than can normally be realized and formed within a CMOS process flow. One such feature is the formation of the BJT base by use of a PMOS lightly doped drain (LDD) implant where a lightly doped implant is provided at the edge of the PMOS gates. By a second such feature, a good emitter for the BJT is provided by using the highly doped, very shallow and very sharp arsenic drain extender which is used in the CMOS process flow for the NMOS transistor. This is possibly the most abrupt, most highly doped drain extender that is known in the production phase of development. The collector is formed using the LDD implantation in forming the NMOS portion of the CMOS transistor. The third feature is the patterned nitride sidewall film that is used to block silicide formation next to the gates of electrostatic discharge (ESD) protection devices. This film is used to prevent, in this case, the emitter/base surface junction from being short circuited by silicide and destroying the transistor action of the vertical device. Because the above described steps utilized in formation of the NPN BJT are already included as patterned steps in the CMOS process, the combined CMOS and BJT devices can be fabricated simultaneously on a single chip by utilizing a special set of BJT layout rules directing the layout of the implants described above. This allows a high performance BJT to be fabricated without additional masking steps while proceeding through a standard CMOS fabrication process.

BRIEF DESCRIPTION OF THE DRAWINGS

FIG. 1a to 1g are a process flow in accordance with the present invention; and

DESCRIPTION OF THE PREFERRED EMBODIMENT

Figure 1D:
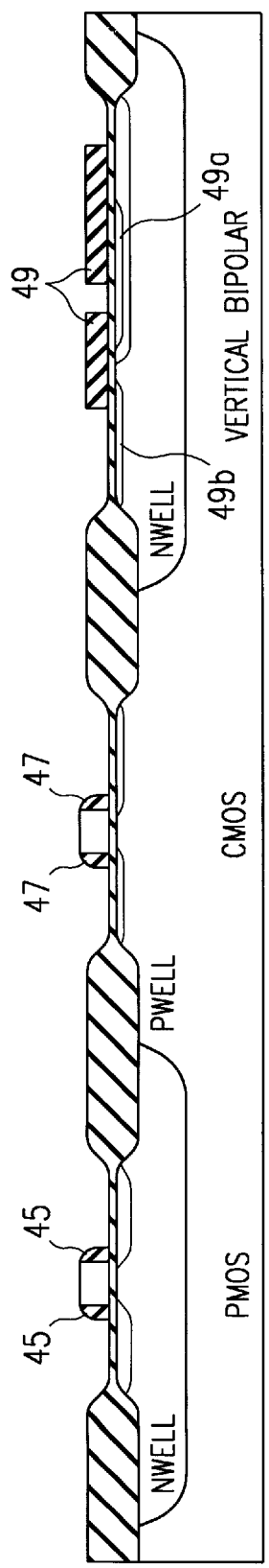

Referring to FIGS. 1a to 1g, as viewed in cross section, a process flow is shown for the simultaneous fabrication of isolated CMOS and vertical bipolar transistors.

As viewed in cross section in FIG. 1a, there is shown a partially fabricated PMOS transistor, NMOS transistor and vertical NPN transistor in the adjacent active regions as provided using the. standard CMOS processing flow up to the gate patterning step thereof. It should be understood that several CMOS transistors and/or several vertical NPN transistors can be fabricated simultaneously on the same semiconductor chip in adjacent and/or spaced apart active regions defined by field oxide as is well known. The partially fabricated structure as shown in FIG. 1a includes a P-type semiconductor wafer 1 having an N-type well 3 in which the PMOS transistor will be fabricated surrounded by a ring of silicon dioxide 5 forming an active element region 7 therein. A thin screen oxide layer 9 covers the active element region 7 with a gate electrode 11 disposed over the thin oxide layer. The structure further includes an N-type well 13 in which the vertical NPN transistor will be fabricated surrounded by a ring of silicon dioxide 15 forming an active element region 17 and a thin screen oxide layer 19 disposed over the active element region 17. A thin screen oxide layer 19 extends over the active element region 23 wherein the NMOS transistor will be fabricated and between the rings of silicon dioxide 5 and 15. A gate electrode 25 is disposed over the oxide layer 21.

With reference to FIG. 1b, the structure of FIG. 1a is patterned with resist 27 over the active element region 7 and a central and edge portion of the active element region 17 and an N-type impurity, preferably an arsenic implant of a mid $10^{14}$ atoms/cm$^2$, is implanted into the exposed portions of the active element regions 17 and 23 to form moderately doped drain (MDD) regions 29 and 31 on opposite sides of the gate electrode 25 and emitter contact 33 and collector contact 35 for the NPN transistor. In the BJT structure, the LDD pattern is designed so that the area for emitter and collector implant is sufficient to allow silicidation and contact to be formed simultaneously with source and drain contacts in patterning the emitter, however, an additional lateral area in the direction of the base contact is implanted. This emitter area will not be silicided and will provide an area for lateral diffusion of minority carriers that are injected from the base contact. The lateral distance for diffusion and recombination will aid in negating the effects of reduced gain typically seen in shallow silicided emitter contacts.

Referring now to FIG. 1c, the resist 27 and screen oxide 9 and 21 are removed and replaced with an LPCVD oxide layer 9' and 21' in place thereof to set the differential diffusion length between the P-type implant for the LDD of the PMOS and the MDD of the NMOS transistors. A resist 37 is then patterned over the active element region 23, the collector contact 35, a portion of the undoped region between the collector contact and the emitter contact 33 and over a portion of the emitter contact. A P-type dopant, preferably a low $10^{14}$ atoms/cm$^2$ boron implant, is implanted into the exposed regions to form lightly doped drain regions 39 and 41 for the PMOS transistor and a base region 43 within the emitter contact region 33 of the bipolar transistor. The tail of the boron implant is sufficient to clear the annealed N-type LDD region and form a good emitter/base profile after anneal.

Referring now to FIG. 1d, the resist 37 is removed and a thick, about 1000 angstrom, layer of LPCVD silicon nitride is deposited in standard manner and lithographically patterned. This pattern is typically utilized to extend the nitride spacers in electrostatic discharge (ESD) devices and is used in this invention to leave silicon nitride blocks at the base/emitter 49a and base/collector 49b surface junctions to prevent silicidation. It is then anisotropically plasma etched to leave silicon nitride spacers 45 and 47 on the sidewalls of the gate electrodes 11 and 25 respectively. This film is used to passivate the emitter/base and base/collector junctions of the NPN transistor and to prevent silicide formation over the most active portion of the emitter. As part of these steps, the sidewall spacers 45 and 47 are formed with the silicon nitride in the active element region 19 providing silicide blocking. The patterned nitride layers are left to prevent silicidation of the base-emitter 49a and base-collector 49b junctions at the point where these junctions intersect the silicon surface. The layers also portect against the removal of the passivating thermal oxide at these locations, insuring a low leakage surface junction. An additional area of silicide is left over the lateral poriton of the implanted emitter area to provide a low recombination rate area for minority carrier diffusion as previously described.

Figure 1E:
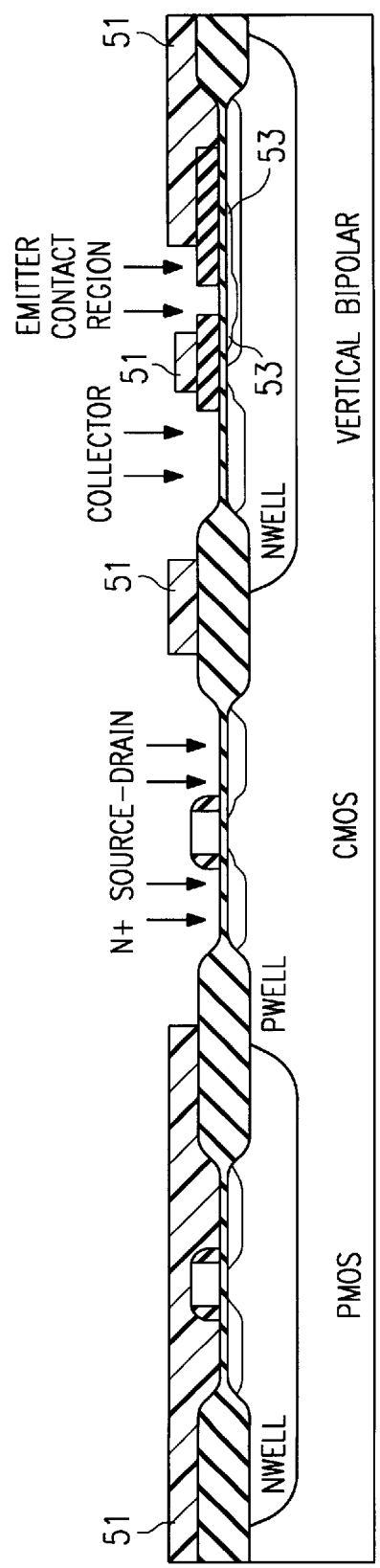

Referring now to FIG. 1e, resist 51 is disposed over the entire active element region 9 and patterned over the entire active element region 19 to expose a portion of the collector contact 35, and portions of silicide blocker 49 at the periphery of the emitter 33. A combination of phosphorous with a concentration of about $1\times10^{14}$ atoms/cm$^2$ at 40 keV and arsenic with a concentration of $1\times10^{15}$ atoms/cm$^2$ at 60 keV is then provided through the openings in the resist 51 to increase the doping level in the collector contact 35 and extrinsic base region 43. The silicide blocker 49 is used as a screening layer to a fraction of the source/drain dose from this implant to reach the base-emitter junction to compensate the high peripheral base doping. This reduces the peripheral base field and increases base-emitter junction breakdown and reliability. This dopant combination is also implanted into the source and drain of the NMOS transistor to drive the drain regions 29 and 31 deeper and laterally and provide N+ doping thereat, to provide additional doping for collector contacts and a lightly doped base-emitter (electric field) spacer region 53 for the NPN transistor.

Figure 1F:
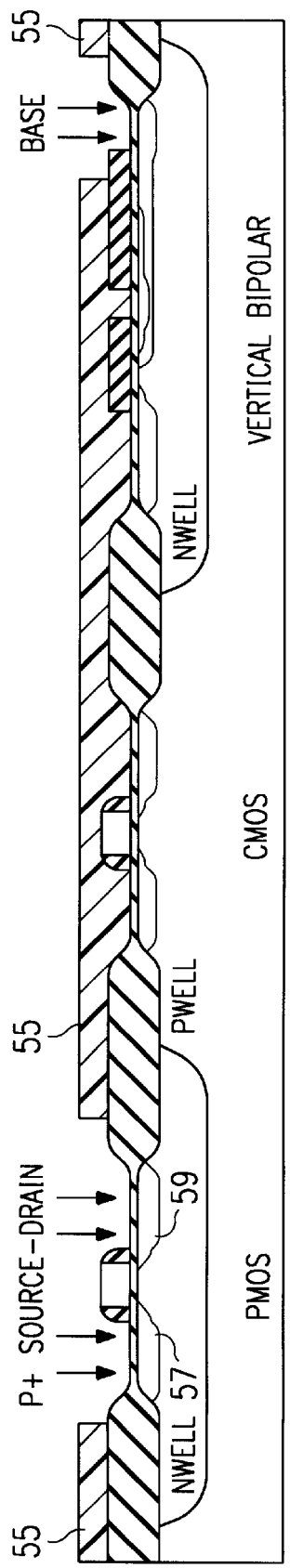

Referring now to FIG. 1f, the resist 51 is removed and resist 55 is patterned over the active element region 21, the entire active element region 19 except a portion of the emitter contact region 33 between the base 43 and the silicon dioxide 15, with the active element region 9 being exposed except for the electrode 11 with sidewall spacer 45 thereon. A P-type dopant is implanted into the exposed portions of the active element region 9 to provide source-drain regions 57 and 59 for the PMOS transistor and into the exposed portion of the emitter contact region 33 to provide the extrinsic base implant, this implant being the same as the PMOS source/drain ($1.0\times10^{15}$ atoms/cm$^2$ at 10 keV) implants of boron.

Figure 1G:
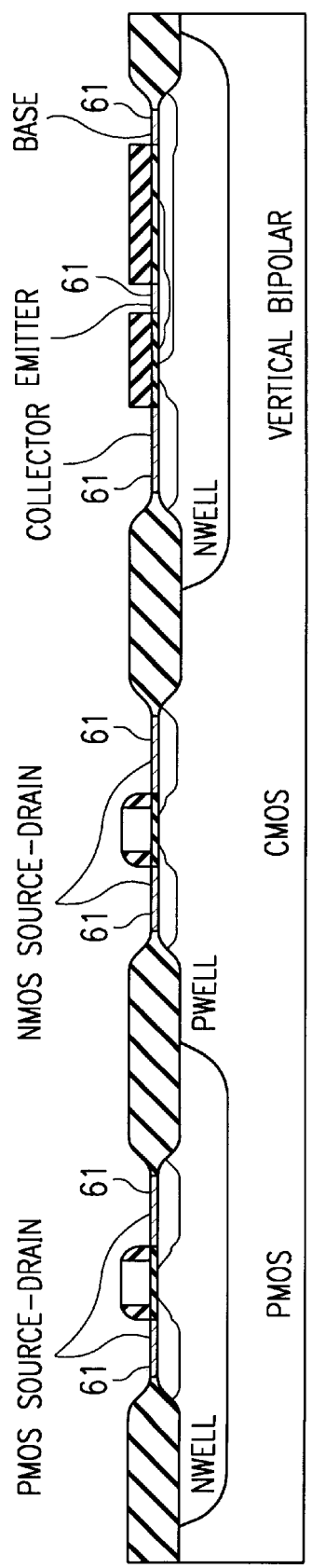

Referring now to FIG. 1g, the resist 55 is removed and silicide 61 is formed at all of the exposed regions in the active element regions 9', 21' and 23, these being the source-drains of the PMOS transistor, the source-drains of the NMOS transistor and the emitter, collector and base of the vertical NPN bipolar transistor.

As can be seen with reference to the vertical bipolar transistor portion of the structure in FIG. 1g, the transistor has the unique qualities of lateral minority carrier emitter diffusion path for reduced base current and increased gain, lightly doped base-emitter spacers for reduced $C_{je}$ and increased $BV_{ebo}$.

The only changes required in a standard CMOS flow to include the above described bipolar transistor into the CMOS process flow are modifications to the reticle generation methods for the CMOS channel implant levels, the CMOS LDD implant levels, the source/drain implant levels and the silicide block level. These modifications are straightforward, software changes that would not impact the more costly wafer fabrication process. The N-type S/D and P-type S/D reticles are used for both the drain extender and heavy source/drain implants. The NPN bipolar flow requires, different masks for these functions. The emitter is formed with the arsenic drain extender implant. This region could not tolerate the heavy N+ source/drain implant, so the N-type S/D reticle is modified to reflect this problem. Likewise, with the P-type LDD and P-type S/D implants. Only the P-type LDD implant is provided in the emitter/base region.

Figure 2:
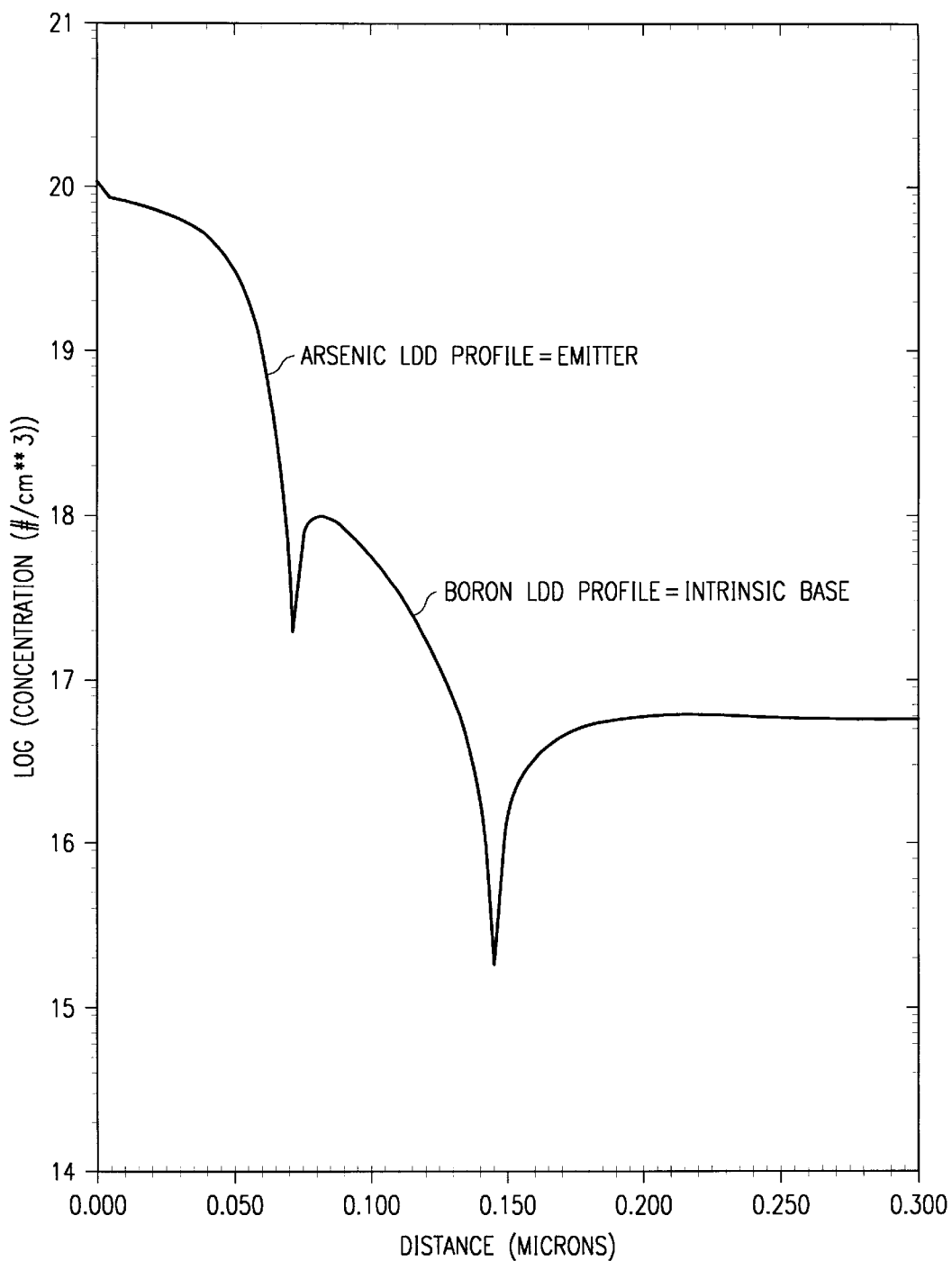
FIG. 2 is a graph showing dopant concentration as a function of distance.

Because the arsenic implant is so shallow, a portion of the P-type LDD region is implanted therethrough and forms the emitter/base junction. The dose of the N-type LDD implant and shallowness of the diffusion make it a good bipolar emitter candidate as can be seen with reference to FIG. 2. The collector portion of the vertical NPN transistor receives both the N-type LDD and the N-type S/D implants to make that junction as deep as possible to reduce the collector resistance.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

We claim:

1. A method of fabricating a vertical bipolar junction transistor concurrently with an MOS device within a CMOS process flow comprising the steps of:

providing a semiconductor wafer having a region of a first conductivity type and having a surface;

forming a pair of spaced apart wells of opposite conductivity type in said region of first conductivity type extending to said surface;

forming gate regions in one of said wells on said surface and in said region of first conductivity type on said surface;

concurrently forming an emitter region in one of said wells extending to said surface and a pair of spaced apart lightly doped drain regions in said region of first conductivity type and on opposite sides of said gate in said region of first conductivity type;

then concurrently forming a base region in said emitter region extending to said surface and a pair of spaced apart lightly doped drain regions in the other of said wells on opposite side of said gate region in said other of said wells;

concurrently forming source and drain regions of said first conductivity type in said lightly doped drain regions in said region of first conductivity type and a collector contact region in said one of said wells extending to said surface; and then forming source and drain regions of said opposite conductivity type in said lightly doped drain regions in said other of said wells.

2. The method of claim 1 wherein said first conductivity type is p-type and said opposite conductivity type is n-type.

3. The method of claim 1 further including the step of forming a sidewall on said gate regions and a mask over the junctions in said one of said wells after said step of then concurrently forming a base region in said emitter region and a pair of spaced apart lightly doped drain regions in the other of said wells on opposite side of said gate region in said other of said wells.

4. The method of claim 2 further including the step of forming a sidewall on said gate regions and a mask over the junctions in said one of said wells after said step of then concurrently forming a base region in said emitter region and a pair of spaced apart lightly doped drain regions in the other of said wells on opposite side of said gate region in said other of said wells.

5. The method of claim 1 further including the step of forming a silicide layer over said source, drain, emitter, base and collector regions on said surface.

6. The method of claim 2 further including the step of forming a silicide layer over said source, drain, emitter, base and collector regions on said surface.

7. The method of claim 3 further including the step of forming a silicide layer over said source, drain, emitter, base and collector regions on said surface.

8. The method of claim 4 further including the step of forming a silicide layer over said source, drain, emitter, base and collector regions on said surface.

* * * * *